United States Patent
Venkataramani et al.

(10) Patent No.: US 7,494,688 B2
(45) Date of Patent: Feb. 24, 2009

(54) METHODS FOR MAKING DOPED MAGNESIUM DIBORIDE POWDERS

(75) Inventors: Venkat Subramaniam Venkataramani, Clifton Park, NY (US); Sylvia Marie DeCarr, Schenectady, NY (US); Sergio Paulo Martins Loureiro, Saratoga Springs, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/491,795

(22) Filed: Jul. 24, 2006

(65) Prior Publication Data

US 2008/0020137 A1    Jan. 24, 2008

(51) Int. Cl.
*B05D 5/12* (2006.01)
*B01J 13/02* (2006.01)
*H01L 39/24* (2006.01)

(52) U.S. Cl. ............ 427/62; 427/212; 427/213.31; 505/434; 505/470

(58) Field of Classification Search ............ 427/62, 427/212, 213.31; 505/434, 470
See application file for complete search history.

(56) References Cited

U.S. PATENT DOCUMENTS

| | | | |
|---|---|---|---|
| 6,630,427 B2 * | 10/2003 | Dunand | 505/452 |
| 6,946,428 B2 * | 9/2005 | Rey | 505/237 |
| 7,018,954 B2 * | 3/2006 | Thieme et al. | 505/430 |
| 2005/0090403 A1 | 4/2005 | Raber et al. | |
| 2005/0127353 A1 | 6/2005 | Suplinskas et al. | |
| 2005/0245400 A1 | 11/2005 | Dou et al. | |

OTHER PUBLICATIONS

W. Mickelson et al.; "Effects of carbon doping on superconductivity in magnesium diboride"; Phys. Rev. B; The American Physical Society (2002) vol. 65, 052505 (3 Pages).
A.V. Pogrebnyakov et al.; "Carbon-Doped $MgB_2$ Thin Films Grown by Hybrid Physical-Chemical Vapor Deposition"; IEEE Transactions on Applied Superconductivity, Jun. 2005, pp. 3321-3324; vol. 15, No. 2.
G. Grasso; "Development of $MgB_2$ conductors for DC and AC applications"; CNR-INFM & Columbus Superconductors Srl Genova, Italy (27 Pages). No Date available.

* cited by examiner

*Primary Examiner*—Brian K Talbot
(74) *Attorney, Agent, or Firm*—Patrick K. Patnode

(57) ABSTRACT

A method for making a doped magnesium diboride powder is provided. The method includes coating a polymeric precursor on at least one of a plurality of particles of a first phase, where the first phase includes a magnesium diboride powder, where the polymeric precursor includes chemical elements yielding a second phase. The second phase includes one or more of a boride, a nitride, a carbide, an oxide, an oxy-boride, an oxy-nitride, an oxy-carbide, or combinations thereof. The method further includes forming a second phase coating onto at least one of the plurality of particles of the magnesium diboride powder.

20 Claims, 6 Drawing Sheets

COAT MAGNESIUM DIBORIDE POWDER WITH POLYMERIC PRECURSOR SOLUTION — 72

HEAT-TREAT THE MAGNESIUM DIBORIDE POWDER TO FORM SECOND PHASE COATING — 74

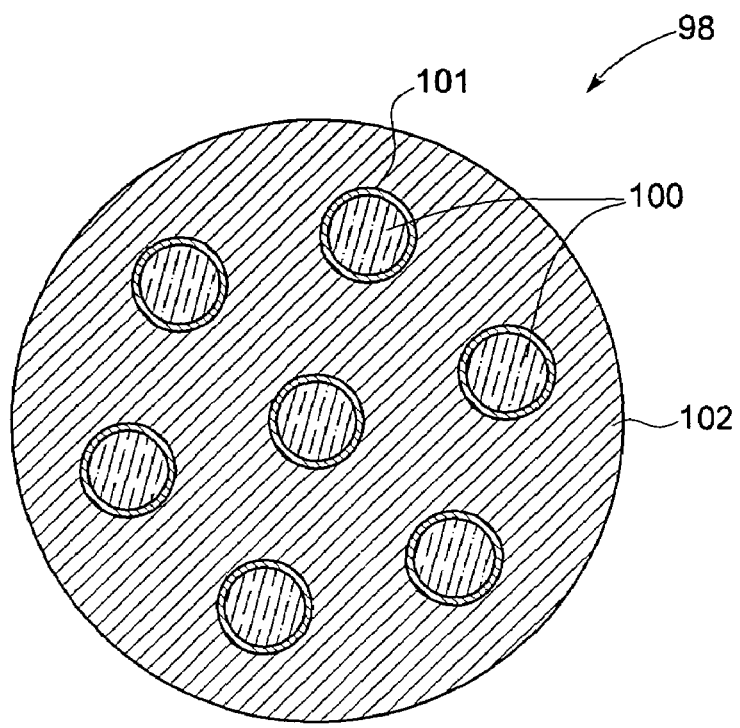

FIG. 8

```
┌─────────────────────────────────────────────────┐
│ CONTACT A FIRST END OF A FIRST WIRE WITH A      │── 104
│ SECOND END OF A SECOND WIRE TO FORM A JOINT     │
└─────────────────────────────────────────────────┘
                        │
                        ▼
┌─────────────────────────────────────────────────┐
│ HEAT THE JOINT TO HAVE THE FIRST AND            │── 106
│ SECOND WIRES IN ELECTRICAL COMMUNICATION        │
└─────────────────────────────────────────────────┘
```

FIG. 9

METHODS FOR MAKING DOPED MAGNESIUM DIBORIDE POWDERS

BACKGROUND

The invention relates generally to methods of manufacturing magnesium diboride powders. In particular, the invention relates to methods of manufacturing doped magnesium diboride powders.

Typically, magnesium diboride is employed as a superconductor in applications such as magnetic resonance imaging (MRI), generators, motors and fault current limiters. Advantageously, magnesium diboride powders display very strongly linked current flows having large critical current densities ($J_c$) on the order of $10^7$ A/cm$^2$ in thin films. Additionally, magnesium diboride powders in the shape of wires, tapes or ribbons display $J_c$ values on the order of $10^5$ A/cm$^2$. Further, the upper critical fields ($H_c$) and irreversibility fields ($H_{irr}$) of these powders are greater than about 30 Tesla in thin films.

Typically, magnesium diboride powders are formed by the reaction of elemental magnesium and boron. The result of this process is the production of a fine powder that exhibits high current carrying capabilities at high magnetic fields, properties that are desirable in applications, such as MRI, where large powerful magnets are required. However, the existing methods of making these powders prevent magnesium diboride from achieving the very high operating fields and critical current values, particularly, when processed into wires. This has prevented employing this technology for applications such as MRI. In consequence, these powders should be customized to enable such applications. For example, for MRI applications, it is desirable to have magnesium diboride powders, which may be drawn into thin wires without breaking while employing conventional drawing methods. In some cases, these properties may be achieved by a combination of doping and the addition of other additive materials in the composition of the magnesium diboride powders during processing of the powder. However, this doping and addition process should be carried out in such a way that prevents coating of the particles of the magnesium diboride by non-superconducting impurities. Also, it is desirable to have a uniform dispersion of the additive materials throughout the magnesium diboride powder.

Accordingly, there is a need for a method of manufacturing magnesium diboride powders and wires which have high JC and Hc values, and are configured for applications, such as MRI.

BRIEF DESCRIPTION

In accordance with one aspect of the present technique, a method for making a doped magnesium diboride powder is provided. The method includes coating a polymeric precursor on at least one of a plurality of particles of a first phase, where the first phase includes a magnesium diboride powder, and where the polymeric precursor includes chemical elements that are configured to produce a second phase. The second phase includes one or more of a boride, a nitride, a carbide, an oxide, an oxy-boride, an oxy-nitride, an oxy-carbide, or combinations thereof. The method further includes forming a second phase coating on the at least one of the plurality of particles.

In accordance with another aspect of the present technique, a method for making a carbon doped magnesium diboride powder is provided. The method includes coating a polymeric precursor on at least one of a plurality of particles of a magnesium diboride powder, the polymeric precursor comprising chemical elements that are configured to yield silicon carbide. The method further includes heat-treating the coated magnesium diboride powder at a predetermined temperature to form a silicon carbide coating on the at least one of the plurality of particles.

In accordance with another aspect of the present technique, a method for making a carbon doped magnesium diboride powder is provided. The method includes dissolving a polymeric precursor in a solvent to form a solution, and mixing a magnesium diboride powder to the solution to form a mixture, where the magnesium diboride powder includes a plurality of particles, and where the polymeric precursor comprises chemical elements that are configured to produce silicon carbide. The method further includes heat-treating the mixture at a predetermined temperature to evaporate the solvent to form a silicon carbide particle onto the magnesium diboride powder.

In accordance with yet another aspect of the present technique, a superconducting powder is provided. The powder includes a first phase having a plurality of magnesium diboride particles having a chemical formula $MgB_{2-x}S_x$, where x represents an atomic percentage, and wherein S represents carbon, boron, nitrogen, oxygen, or combinations thereof. The powder further includes a second phase surrounding each of the plurality of magnesium diboride particles, where the second phase includes a carbide, a nitride, an oxide, a boride, an oxy-nitride, an oxy-boride, an oxy-carbide, or combinations thereof.

In accordance with another aspect of the present technique, a carbon doped magnesium diboride powder is provided. The powder includes a plurality of magnesium diboride particles having a chemical formula $MgB_{2-x}C_x$, where x represents an atomic percentage. The powder further includes a plurality of silicon carbide particles surrounding each of the plurality of magnesium diboride particles. The powder is formed by employing the methods of the present techniques.

DRAWINGS

These and other features, aspects, and advantages of the present technique will become better understood when the following detailed description is read with reference to the accompanying drawings in which like characters represent like parts throughout the drawings, wherein:

FIG. 8 is a schematic illustration of an alternate embodiment of the wire illustrated in FIG. 7; and FIG. 9 is a flow chart illustrating exemplary method of making a wire according to certain embodiments of the present technique.

DETAILED DESCRIPTION

Figure 1:
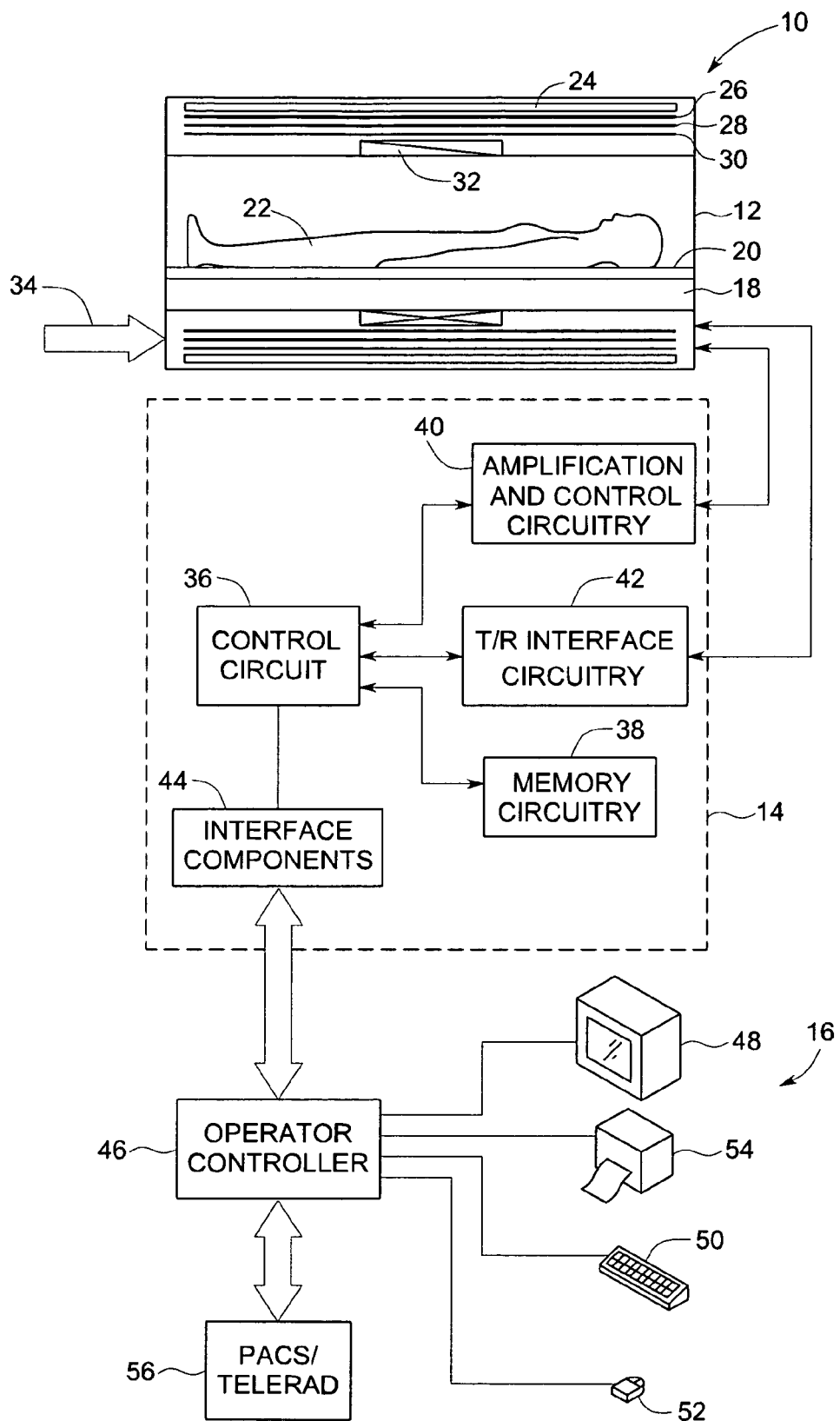
FIG. 1 is a diagrammatical representation of an MRI system for use in medical diagnostic imaging according to certain embodiments of the present technique.

Referring now to FIG. 1, a magnetic resonance imaging (MRI) system 10 is illustrated diagrammatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desirable position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radiofrequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radiofrequency coil (RF) 32 is provided for generating RF pulses for exciting the gyromagnetic material. In the embodiment illustrated in FIG. 1, coil 32 also serves as a receiving coil. Thus, RF coil 32 may be coupled with driving and receiving circuitry in passive and active modes for receiving emissions from the gyromagnetic material and for applying radiofrequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In the presently contemplated configuration, the gradient coils 26, 28 and 30 have different physical configurations adapted to their function in the imaging system 10. As will be appreciated by those skilled in the art, the coils are comprised of superconductive elements, such as wires, cables, bars or plates which are wound or cut to form a coil structure which generates a gradient field upon application of control pulses as described below. In certain embodiments, the superconducting elements include doped magnesium diboride powders having a first phase and a second phase. In certain embodiments, the first phase may include a plurality of magnesium diboride particles, which are surrounded by the second phase. As will be described in detail below, the second phase may include particles or films of carbide, boride, nitride, oxide, oxy-carbide, oxy-boride, oxy-nitride, or combinations thereof. The placement of the coils within the gradient coil assembly may be done in several different orders, but in the present embodiment, a Z-axis coil is positioned at an innermost location, and is formed generally as a solenoid-like structure which has relatively little impact on the RF magnetic field. Thus, in the illustrated embodiment, gradient coil 30 is the Z-axis solenoid coil, while coils 26 and 28 are Y-axis and X-axis coils respectively.

The coils of scanner 12 are controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two.

The coils of scanner 12 are controlled by scanner control circuitry 14 to generate the desired magnetic field and radiofrequency pulses. In the diagrammatical view of FIG. 1, control circuitry 14 includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radiofrequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52.

A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems (PACS), teleradiology systems, and the like.

Figure 3:
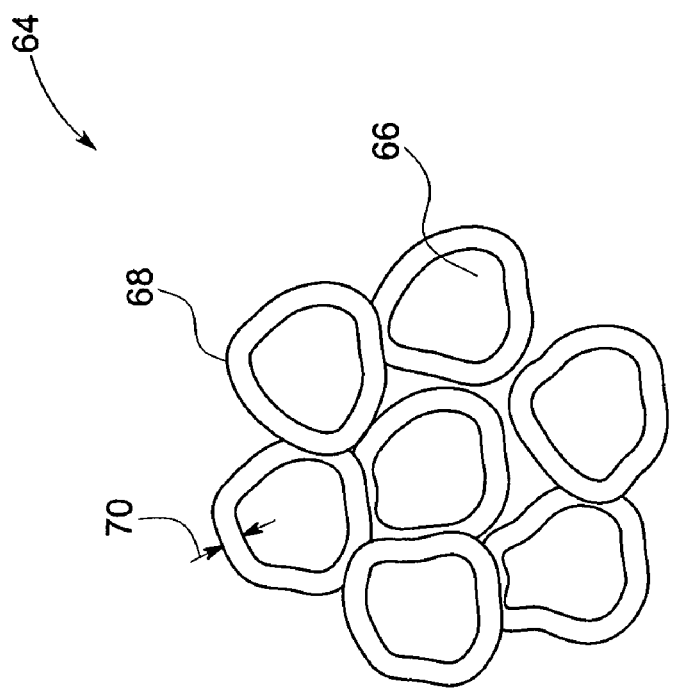
FIGS. 2-3 are cross sectional views of magnesium diboride powder having silicon carbide particles disposed on the plurality of particles.
Figure 2:
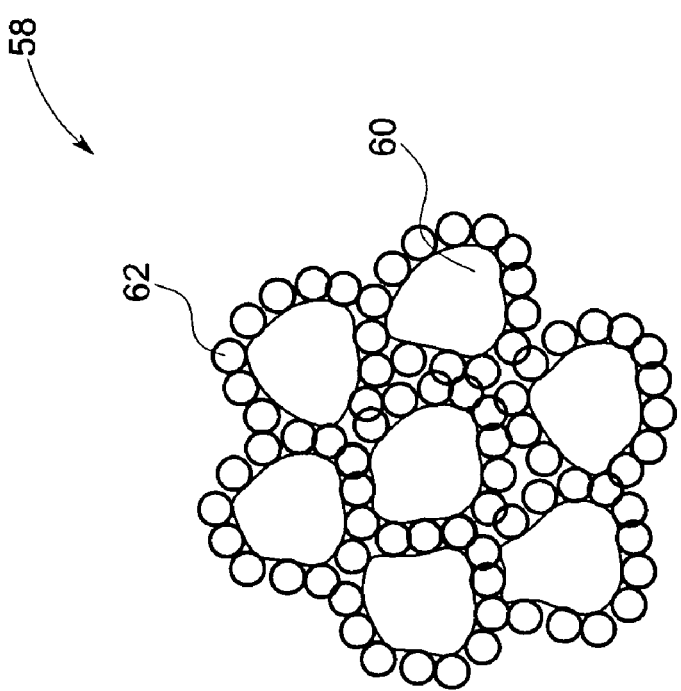

Turning now to FIGS. 2 and 3, doped magnesium diboride powders having a first phase and a second phase are illustrated. In the illustrated embodiment, the doped magnesium diboride powders include a first phase, which includes a plurality of magnesium diboride particles that are surrounded by second phase coating such as particles or films. In certain embodiments, the second phase may include carbide, boride, nitride, oxide, oxy-carbide, oxy-boride, oxy-nitride, or combinations thereof. In an exemplary embodiment, the second phase may include silicon carbide. In another embodiment, the second phase may include silicon oxy-carbide.

In certain embodiments, the doped magnesium diboride powders may include the plurality of magnesium diboride particles that may be represented by a chemical formula $MgB_{2-x}S_x$, where S represents the dopant, and B represents the chemical element boron. In certain embodiments, S may include one or more of carbon, boron, oxygen, nitrogen or combinations thereof. In one embodiment, S includes carbon, i.e., the magnesium diboride powder is carbon doped. In other embodiments, S includes boron, nitrogen or oxygen. In these embodiments, the magnesium diboride powder is boron doped, nitrogen doped or oxygen doped. Further, x represents an atomic percentage of the dopant S that substitutes boron in the magnesium diboride lattice. In some embodiments, the value of x may vary in a range of about 5 percent to about 15 percent, from about 6 percent to about 12 percent, and preferably in a range of about 8 percent to about 10 percent. Preferably, the doping S in the magnesium diboride lattice may be homogeneous. The doping of S into the lattice of magnesium diboride may result in higher upper critical field ($H_c$). Additionally, dispersing the second phase, such as silicon carbide particles throughout the microstructure of magnesium diboride may enhance the critical current density ($J_c$). As will be appreciated, high values of both $H_c$ and $J_c$ are required for MRI applications.

As illustrated in FIG. 2, in certain embodiments of the doped magnesium diboride powders 58, the first phase having the magnesium diboride particles 60 may be surrounded by relatively smaller second phase particles 62 such as silicon carbide particles. In these embodiments, the size of the magnesium diboride particles 60 may vary in a range of about 20 nanometers to about 500 micrometers, and the size of the second phase particles 62 may be in a range of about 5 nanometers to about 50 nanometers. Accordingly, due to relatively smaller particle size of the magnesium diboride powder 58, it may be possible to form wires from these powders which have a higher fraction of superconducting material, that is, which have a higher fraction of magnesium diboride as compared to other conventional cables of magnesium diboride powders. These wires in turn may be used to form cables.

As will be appreciated, a higher amount of superconducting material enables high current density ($I_c$), critical current density ($J_c$) and upper critical field ($H_c$). In an exemplary embodiment, $I_c$ at self-field and 4K may be in a range of about 80 A to about 1000 A. In another embodiment, $J_c$ may be in a range of about $10^5$ A/cm$^2$ to about $10^7$ A/cm$^2$. In one embodiment, $H_c$ may be in a range of about 10 Tesla to about 100 Tesla.

FIG. 3 illustrates an alternate embodiment of the doped magnesium diboride powder 58 of FIG. 2. In the illustrated embodiment, the magnesium diboride powder 64 includes first phase having magnesium diboride particles 66 surrounded by a thin film 68 of the second phase such as silicon carbide. In this embodiment, the magnesium diboride particles 66 and the silicon carbide thin film 68 may form a core-shell structure with magnesium diboride particles 66 forming the core and the silicon carbide thin film 68 forming the shell. In certain embodiments, the thickness 70 of the thin film 68 may be on the order of a few nanometers. In an exemplary embodiment, the thickness 70 of the thin film 68 may be less than about 9 nanometers to prevent loss of percolation current density due to the non-conducting nature of silicon carbide.

Figure 4:
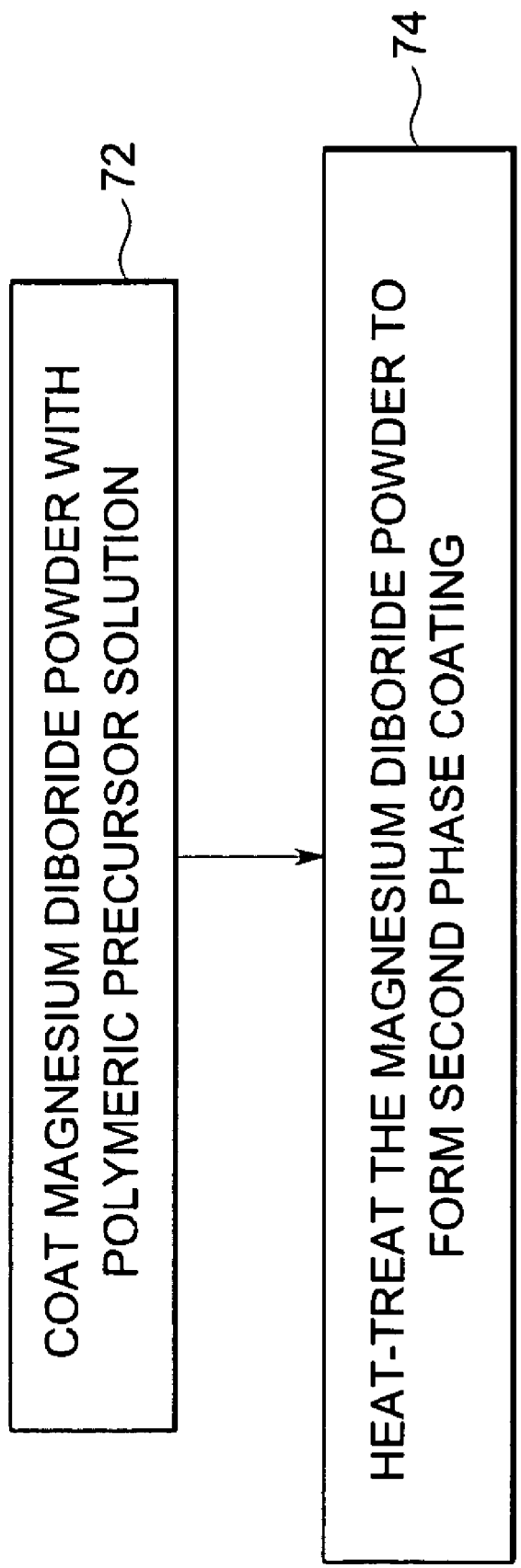
FIGS. 4-5 are flow charts illustrating exemplary methods of manufacturing magnesium diboride powders according to certain embodiments of the present technique.
Figure 5:
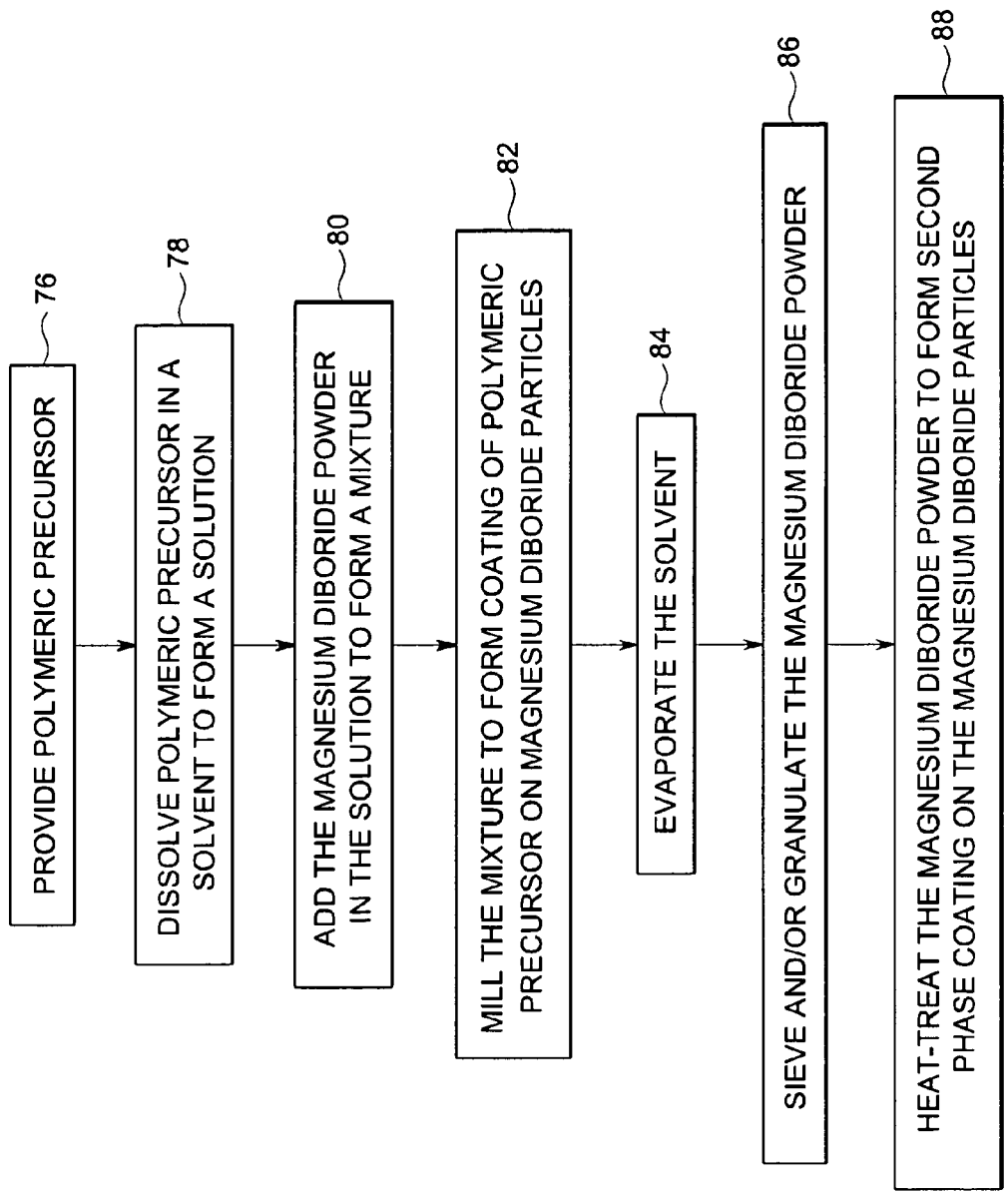

FIGS. 4 and 5 are exemplary embodiments illustrating methods of making doped magnesium diboride powders in accordance with the present techniques. In the illustrated embodiment of FIG. 4, a doped magnesium diboride powder is formed in two steps. At block 72, a first phase or a magnesium diboride powder having a plurality of magnesium diboride particles is coated with a polymeric precursor, which includes chemical elements that are configured to yield one or more second phase particles. For example, the polymeric precursor may include chemical elements that are configured to produce silicon carbide upon heat-treatment. Subsequently, at block 74, the coated magnesium diboride powder is subjected to heat-treatment to form doped magnesium diboride powder including magnesium diboride particles having the second phase particles or coatings disposed thereon. As used herein, the term "second phase coating" refers to the embodiments having second phase particles dispersed throughout the microstructure of the magnesium diboride particles, and also to the embodiments having the second phase thin film coating on the magnesium diboride particles.

FIG. 5 illustrates a more detailed method of forming a doped magnesium diboride powder, in accordance with embodiments of the present technique. At block 76, a polymeric precursor is provided, where the polymeric precursor includes chemical elements that are configured to produce one more second phases. The polymeric precursor may include, for example chemical elements, which are configured to yield silicon carbide. In one embodiment, an organometallic precursor of silicon carbide may be used. In an exemplary embodiment, a silicon carbide polymeric precursor may include polysilazane, modified siloxane, hyperbranched polycarbosilanes of the type [R$_3$SiCH$_2$—]$_x$[—SiR$_2$CH$_2$—]$_y$—[—SiR(CH2-)$_{1.5}$]$_z$[—Si(CH$_2$—)$_2$], where R may be H, —CH$_2$CH=CH$_2$, or a partially-allyl substituted derivative "AHPCS", nominally ['Si(allyl)0.1H0.9CH2']n, a polyacrylic nitrate (as a carbon source), a polyoxane, a cyanoxane, a carbonate, or combinations thereof.

At block 78, the polymeric precursor is dissolved in a solvent to form a solution. In embodiments where the polymeric precursor is a thermoplastic, the polymeric precursor may be pre-melted into a liquid under controlled atmosphere and the magnesium diboride powder may subsequently be blended into the liquid by using techniques such as milling, high density mixing to form a uniform coating of the polymeric precursor on the magnesium diboride particles. In some embodiments, the solvent may include one or more ketones, alcohols, THF, or combinations thereof. In one embodiment, the solvent includes ethanol.

At block 80, a magnesium diboride powder is added to the solution to form a mixture. The magnesium diboride powder may be commercially available. Subsequently, at step 82, the magnesium diboride powder and the polymeric precursor solution are mixed, by milling, high density mixing for example, to form a homogeneous mixture of the powder and the precursor and to coat the polymeric precursor solution on the magnesium diboride particles.

Additionally, the amount of doping of carbon, oxygen, nitrogen, or boron may be increased in a controlled fashion by addition of their respective sources. For example, the amount of carbon doping may be increased by adding suitable amounts of carbon sources such as carbon fibers, carbon nanoparticles to the mixture. Further, titanium, lithium, yttria, aluminum, silicon, and/or zirconium may also be added to the mixture to further enhance $J_c$. Preferably, these additives may be in the form of nanoparticles to facilitate homogeneous dispersion of these additives throughout the bulk of the magnesium diboride powder.

Subsequently, at block 84, the solvent may be removed from the solution to form a coating of the polymeric precursor on the plurality of magnesium diboride particles. In one embodiment, the solvent may be evaporated from the solution. In certain embodiments, the evaporation of the solvent may be carried out in an inert atmosphere or vacuum, thereby preventing any undesired contaminants, such as oxygen, from entering the bulk of the magnesium diboride powder. The solvent may be removed by heating the mixture at a temperature of about 15° C. to about 100° C. Further, the mixture may be heated in an inter atmosphere or vacuum.

In alternate embodiments, the magnesium diboride particles may be coated with the polymeric precursor by employing deposition techniques such as metal organic chemical vapor deposition, reactive plasma assisted chemical vapor deposition, reactive plasma assisted physical vapor deposition, chemical vapor infiltration, or combinations thereof.

At block 86, the magnesium diboride powders coated with polymeric precursor may be subjected to sieving and/or granulation to obtain a homogeneous particle size. At block 88, the magnesium diboride powder is subjected to heat-treatment to form second phase coating, such as silicon carbide coating, on the magnesium diboride particles and to diffuse dopants, such as carbon, into the lattice of the magnesium diboride. In an exemplary embodiment, during heating, the polymeric decomposition or pyrolysis of the precursor forms silicon carbide, thereby forming silicon carbide coating on the magnesium diboride particles. In certain embodiments, the heat-treating may be carried out in an oxygen-free environment to prevent any formation of non-conducting oxides in the powder which may result in decrease of $J_c$. In another embodiment, the heat-treating may be carried out in inter atmosphere or a vacuum.

Further, the heat-treatment may be carried out at a slow rate to facilitate homogeneous diffusion of dopants in the magnesium diboride lattice and homogeneous dispersion of the second phase particles in the bulk. In one embodiment, the magnesium diboride particles coated with polymeric precursor may be subjected to sintering to facilitate homogeneous dispersion of the second phase particles and homogeneous doping. In certain embodiments, the heat-treatment may be carried out at a temperature in a range of about 1400° C. to about 1900° C. In some embodiments, the heat-treatment is carried out for a period of time in a range of from about 1 hour to about 24 hours. Further, the heat-treatment may be carried out at a pressure in a range of from about $10^{-6}$ atm. to about 1 atm.

The magnesium diboride powder made by the various techniques described above may be drawn into various shapes such as wires, cables, or sheets. In one embodiment, the sheets may be encased in metal. In this embodiment, co-extrusion or swagging may be employed to produce these composite structures of magnesium diboride sheets encased in metal. The cables formed from the magnesium diboride powders of the present technique may be employed in imaging applications, such as MRI. As described above, these cables have high $I_c$, $J_c$ and $H_c$, thereby making these cables a desirable candidate for MRI applications. Additionally, the magnesium diboride powders of the present technique may be easily drawn into mono-filament or multi-filament cables having diameters in a range of about 1 mm to 5 mm. Also, the mechanical strength of these cables may be suited for various applications. In an exemplary embodiment, the stress experienced by the wires/cables may be in a range from about 50 MPa to about 500 MPa, and the strain experienced by the wires/cables may be in a range from about −1% to about 1%. In one embodiment, the length of the wires/cables may be in a range from about 10 cm to about $10^6$ cm.

Figure 6:
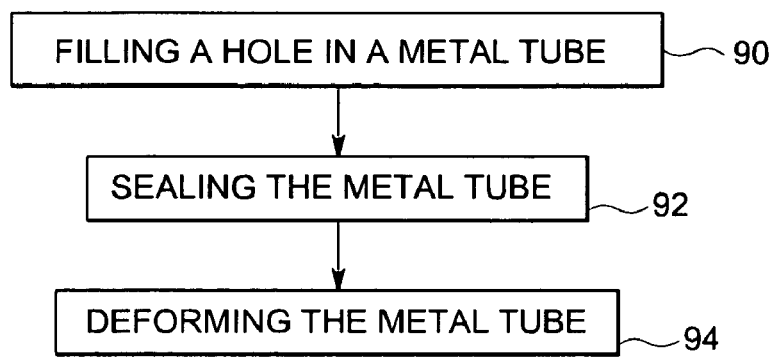
FIG. 6 is a flow chart illustrating exemplary method of making a wire according to certain embodiments of the present technique.

FIG. 6 is an exemplary embodiment illustrating a method of making a wire of the doped magnesium diboride powder. At block 90, a hole through a metal tube, defining a hollow metal tube, is filled with the doped magnesium diboride powder. The particles of the doped magnesium diboride powder are in the form of rods, pellets, powder, particles, flakes, or combinations thereof. In one embodiment, the metal tube comprises copper, copper alloys, stainless steel, tantalum, magnesium, nickel alloys, or combinations thereof. In one embodiment, the ratio of a radius of the hole to the radius of the tube is about 0.1 to about 0.99, prior to the deforming (block 94).

At block 92, the ends of the metal tube are sealed. Subsequently, at block 94, the metal tube is deformed to increase the length and to reduce the cross-sectional area. The wire may be further flattened to a tape or a film if desired. In one embodiment, the metal tube may be deformed by employing processes, such as extrusion, forging, rolling, swaging, drawing or combinations thereof. Following the deformation process, the wire, tape or film may be heat treated to improve the superconducting properties and/or the mechanical properties. In one embodiment, the wire may be heat treated at a temperature of greater than or equal to about 600° C. for a time period of greater than or equal to about 1 hour.

The wires may be advantageously formed into other similar electrically conducting structures, such as flattened tapes and wound multi-wire cables. Applications for superconducting wires are found in electromagnetic devices such as superconducting magnets, motors, transformers, and generators. Such electromagnetic devices may in turn be incorporated into larger systems, such as, for example, a magnetic resonance imaging system.

Figure 7:
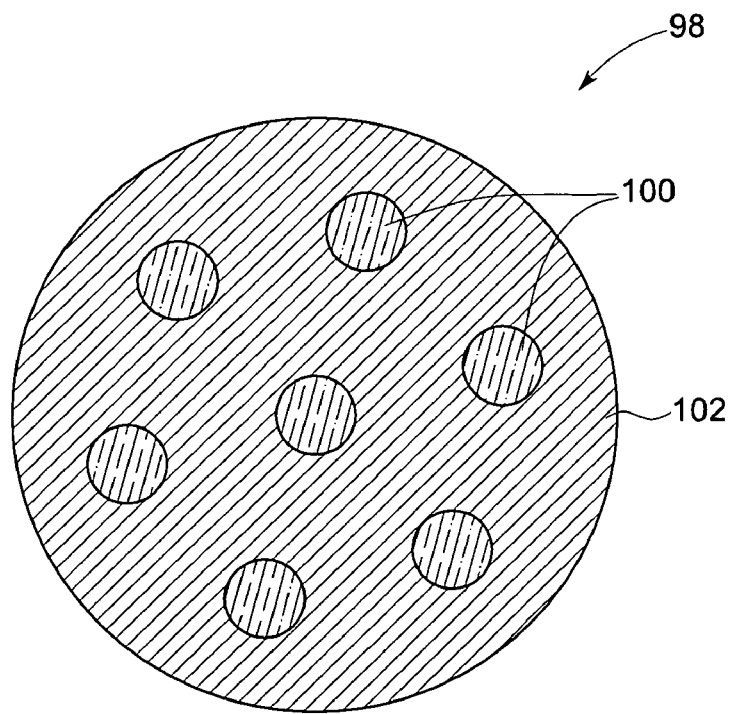
FIG. 7 is a schematic representation of a cross-sectional view of the wire made by using the method of FIG. 6.

FIG. 7 is a schematic representation of a cross-sectional view of one exemplary embodiment of the superconducting wire 98. Superconducting wire 98 includes at least one filament 100 having a doped magnesium diboride powder. The filament 100 is disposed in a metal matrix 102. For example, the metal matrix 102 may include the material of the metal tube employed to fill the magnesium diboride powders as described above with regard to FIG. 6. Although seven such filaments 100 are represented in the FIG. 7, there is no limit to the number of filaments 100 contained within superconducting wire 98, depending on the size of the superconducting wire 98, the size of each of the filaments 100 and the desired properties of the superconducting wire 98. In one exemplary embodiment, the superconducting wire 98 may have a diameter in the range of approximately 0.5 mm to approximately 1.0 mm. Further, the filaments 100 may each of a diameter in the range of approximately 0.02 mm to approximately 0.1 mm.

In accordance with another exemplary embodiment, once the superconducting wire 98 is formed, as described above, the wire may be twisted to reduce the AC loss through the wire. As will be appreciated, twisting the wire generally reduces the flux linkage through the wire which may reduce the AC loss through the wire. The number of twists formed in the superconducting wire 98 may vary depending on the desired effect. This aspect may be quantified by referring to the "pitch" of the twisted superconducting wire 98. As used herein, the "pitch" of the twisted superconducting wire 98 refers to the length of wire traversed to complete one full rotation (twist) of the wire. For example, if the superconducting wire 98 is twisted, such that the wire is rotated one full twist over a length of wire equal to 50 mm, the superconducting wire 98 is said to have a "pitch" equal to 50 mm. In one exemplary embodiment, the pitch may be in the range of approximately 20 mm to approximately 200 mm. Twisting may be particularly advantageous in low frequency applications, such as those below 200 Hz, for example.

Following the manufacturing of the doped magnesium diboride superconducting wire, such as the wire 98, the wire may be welded or diffusion bonded to produce a continuous length of superconducting wire having a length at least equal to the sum of the lengths of each of the superconducting wires that are welded together. Diffusion bonding is a solid phase process achieved via atomic migration with no macro-deformation of the portions of the superconducting wire to be bonded.

FIG. 8 is a schematic representation of a cross-sectional view of another exemplary embodiment of the superconducting wire 98. As with the embodiment illustrated in FIG. 7, the superconducting wire 98 illustrated in FIG. 8 includes at least one filament 100 having a doped magnesium diboride powder. The filament 100 is disposed in a metal matrix 102. In some embodiments, the metal matrix 102 may be configured to act as a barrier layer. In other embodiments, an additional barrier layer, such as a barrier layer 101, may be disposed at least partially around the filament 100. In these embodiments, before the filament 100 is disposed in the metal matrix 102, in accordance with the presently illustrated embodiment, each filament 100 may be coated with a barrier layer 101. The barrier layer 101 may comprise a non-superconductive material such as stainless steel, steel, nickel, or superconductive material such as niobium, for example. Further, the barrier layer 101 may have a thickness in the range of approximately 0.001 mm to approximately 0.05 mm. Advantageously, the barrier layer 101 may be employed to increase the resistance between the individual filaments 100, thereby reducing the AC loss through the superconducting wire 98. Further, use of the barrier layer 101 may decrease the likelihood of alloy formation due to chemical reactions between the filament 100 and the metal matrix 102. In one exemplary embodiment, the metal tube in which the doped magnesium diboride powder is disposed (e.g., block 90 of FIG. 6) may be wrapped in the barrier layer 101, before introduction of the metal matrix 102 in which the filaments 100 are arranged.

FIG. 9 illustrates an exemplary method of making conducting wires, in accordance with embodiments of the present technique. At block 104, a first superconducting wire is disposed in contact to a second superconducting wire to form a joint. At block 104, the first end of the first superconducting wire and the second end of the second superconducting wire are heated at the joint to form a single wire. In one embodiment, the resultant superconducting wire may have a length greater than or equal to the length of the first superconducting wire or the length of the second superconducting wire. In one embodiment, the length of the superconducting wire may be greater than or equal to about 10668000 cm. The point at which the two wires are heated may be a single point or it may be a section at which the two wires overlap. The joint may be a spot weld or a butt weld, or any other kind of weld desired.

The joining is generally carried out using at least one source of energy, such as, the energy provided by a beam of light, wherein the energy provided by the source is directed at those portions of the superconducting composition that are to be joined together. The interaction of the energy with the superconducting composition facilitates the heating of the composition, and this increase in the temperature may be advantageously utilized to facilitate the joining of the superconducting composition. Preferable methods of joining are electron beam welding, laser welding, ultrasonic welding, plasma arc welding, resistance welding and the like.

In yet another embodiment, the overlapping section comprising the exposed ends of the superconducting filaments along with a filler material comprising a doped magnesium diboride powder, a magnesium diboride powder, or a combination of magnesium powder and boron powder are resistively heated. The heating promotes a chemical reaction between the magnesium and the boron to produce magnesium diboride. The magnesium diboride may be used to facilitate the joining of the superconducting wire.

In one embodiment, the joining generally occurs at a temperature of about 650° C. to about 1000° C. It is generally desirable to perform the joining in a manner so as to obtain a "bridge superconducting cross section" between the first end of the first superconducting wire and the second end of the second superconducting wire. When the bridge superconducting cross section is less than the superconducting cross section on the filament or the tape, the bridge superconducting cross section limits the current carrying capacity in the connected superconducting elements. Therefore, the bridge superconducting cross section is, preferably, at least as large as the superconducting cross section on the filament or the tapes.

The current carrying capacity of a formed joint can be tested by soldering voltage probes to the superconducting filament tape on both sides of the weld. The joint is cooled below the critical temperature of the superconductor and increasing amounts of current are passed through the weld while the voltage change between the probes is monitored. The current at which a sufficient voltage change is detected, e.g., about 0.02 micro volts, is the critical current. If the current carrying capacity in the weld is less than the current carrying capacity in the filament and/or tape, the number of bridges or size of the bridges can be increased in the joint to form a larger bridge superconducting cross section.

As stated above, these methods of joining may be effectively used to create extended sections of the superconducting wire that may be advantageously used in electrically conducting structures, including, but not limited to, flattened tapes, laminated wires formed from multiple wires, and wound multi-wire cables. Applications for superconducting wires are found in electromagnetic devices such as, but not limited to, superconducting magnets for motors, transformers, and generators. Such electromagnetic devices may in turn be incorporated into larger systems, such as, for example, a magnetic resonance imaging system.

Although the magnesium diboride powders of the present technique are described with respect to MRI applications, as will be appreciated, the magnesium diboride powders as disclosed above may be employed in several other techniques, such as power generation, generators, motors, fault current limiters, or any other superconducting applications.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for making a doped magnesium diboride powder, comprising:
   coating a polymeric precursor on at least one of a plurality of particles of a first phase, wherein the first phase comprises a magnesium diboride powder, the polymeric precursor comprising chemical elements which are configured to yield a second phase, wherein the second phase comprises one or more of a boride, a nitride, a carbide, an oxide, an oxy-boride, an oxy-nitride, an oxy-carbide, or combinations thereof; and
   heat-treating or cooling, or both, the plurality of particles of the first phase having the polymeric precursor to form a second phase coating onto the at least one of the plurality of particles of the magnesium diboride powder to form a doped magnesium diboride powder.

2. The method of claim 1, wherein the coating comprises:
   providing a solution of the polymeric precursor; and
   forming a coating of the solution of the polymeric precursor on the at least one of the plurality of particles of the magnesium diboride powder by mixing the solution of the polymeric precursor with the magnesium diboride powder.

3. The method of claim 2, wherein the solution of the polymeric precursor comprises a mixture of the polymeric precursor and a solvent, a polymeric precursor dissolved in a liquid, a mixture having a pre-melted polymeric precursor, or combinations thereof.

4. The method of claim 3, wherein the step of heat-treating, or cooling, or both comprises evaporating the solvent, or cooling the mixture having the pre-melted polymeric precursor to solidify the polymeric precursor, or both, to form the second phase coating on the at least one of the plurality of magnesium diboride particles.

5. The method of claim 1, wherein the step of heat-treating, or cooling, or both comprises heat-treating coated magnesium diboride powder at a temperature in a range of about 1400°C. to about 1900°C.

6. The method of claim 5, wherein the heat-treating comprises heat-treating the magnesium diboride powder in an inert atmosphere, a non-oxygenating atmosphere, or a vacuum.

7. The method of claim 1, wherein the polymeric precursor comprises a polysilazane, modified siloxane, hyperbranched polycarbosilanes of the type $[R_3SiCH_2-]_x[-SiR_2CH_2-]_y[-SiR(CH2-)_{1.5}]_z[-Si(CH_2-)_2]$, where R comprises H, $-CH_2CH=CH_2$, or a partially-allyl substituted derivative, nominally ['Si(allyl)0.1H 0.9CH2']n, a polyacrylic nitrate, a polyoxane, a cyanoxane, a carbonate, or combinations thereof.

8. The method of claim 1, further comprising doping the first phase having the magnesium diboride powder with dopants comprising carbon, boron, nitrogen, oxygen, or combinations thereof.

9. The method of claim 1, further comprising adding carbon fibers, carbon nanoparticles, titanium, lithium, yttria, aluminum, silicon, zirconium, or combinations thereof to the magnesium diboride powder.

10. The method of claim 1, further comprising sieving the magnesium diboride powder prior to the step of heat-treating, or cooling, or both.

11. The method of claim 1, further comprising granulating the magnesium diboride powder prior to the step of heat-treating, or cooling, or both.

12. The method of claim 1, wherein the step of heat-treating, or cooling, or both, further comprises doping the magnesium diboride powder with carbon, boron, nitrogen, oxygen, or combinations thereof.

13. The method of claim 1, wherein the step of coating comprises metal organic chemical vapor deposition, or reactive plasma assisted chemical vapor deposition, or reactive plasma assisted physical vapor deposition, or chemical vapor infiltration, or combinations thereof.

14. A method for making a carbon doped magnesium diboride powders, comprising:
   coating a polymeric precursor on at least one of a plurality of particles of a magnesium diboride powder, the polymeric precursor comprising chemical elements that are configured to yield silicon carbide; and
   heat-treating the coated magnesium diboride powder to form a silicon carbide coating on the at least one of the plurality of particles.

15. A method for making a carbon doped magnesium diboride powder, comprising:
   dissolving a polymeric precursor in a solvent to form a solution, wherein the polymeric precursor comprises chemical elements that are configured to produce silicon carbide;
   mixing a magnesium diboride powder to the solution to form a mixture, wherein the magnesium diboride powder comprises a plurality of particles, and wherein the polymeric precursor comprises silicon carbide; and
   heat-treating the mixture to evaporate the solvent while pyrolyzing the polymeric precursor to form a silicon carbide coating onto the magnesium diboride powder.

16. The method of claim 15, wherein the solvent comprises ketone, ethanol, THF, or combinations thereof.

17. The method of claim 15, wherein the heat-treating comprises heat-treating the magnesium diboride powder for a period of time in a range of from about 1 hour to about 24 hours.

18. The method of claim 15, wherein the heat-treating comprises heat-treating the magnesium diboride powder in an inert atmosphere, a non-oxygenating atmosphere, or vacuum.

19. The method of claim 15, wherein the heat-treating comprises heat-treating the magnesium diboride powder at a pressure in a range of from about $10^{-6}$ atm to about 1 atm.

20. The method of claim 15, where the step of evaporating comprises evaporating the solvent in an inert atmosphere.

* * * * *

UNITED STATES PATENT AND TRADEMARK OFFICE
CERTIFICATE OF CORRECTION

PATENT NO. : 7,494,688 B2  Page 1 of 1
APPLICATION NO. : 11/491795
DATED : February 24, 2009
INVENTOR(S) : Venkataramani et al.

It is certified that error appears in the above-identified patent and that said Letters Patent is hereby corrected as shown below:

In Column 1, Lines 46-47, delete "JC and Hc" and insert -- $J_c$ and $H_c$ --, therefor.

Signed and Sealed this

Twenty-eighth Day of April, 2009

JOHN DOLL
*Acting Director of the United States Patent and Trademark Office*